(12) United States Patent
Kang

(10) Patent No.: US 7,409,661 B2
(45) Date of Patent: Aug. 5, 2008

(54) COMPUTER-AIDED THERMAL RELIEF PAD DESIGN SYSTEM AND METHOD

(75) Inventor: Lee-Chieh Kang, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 158 days.

(21) Appl. No.: 11/308,769

(22) Filed: May 1, 2006

(65) Prior Publication Data
US 2007/0079275 A1    Apr. 5, 2007

(30) Foreign Application Priority Data
Sep. 30, 2005    (CN)    ............. 2005 1 0100074

(51) Int. Cl.
*G06F 17/50*    (2006.01)
(52) U.S. Cl. ............. 716/11; 716/8; 716/9; 716/10
(58) Field of Classification Search ............. 716/15, 716/8, 9, 10, 11
See application file for complete search history.

(56) References Cited
U.S. PATENT DOCUMENTS 5,831,826 A * 11/1998 Van Ryswyk ............ 361/719
6,823,501 B1 11/2004 Dahl
6,941,535 B2 9/2005 Sekido
7,002,572 B1 2/2006 Teig et al.

OTHER PUBLICATIONS

Altium, "PCB Editor:Internal Power and Split Planes", Dec. 9, 2003, Product Description (AR0126 v1.0), 9 pages.*

* cited by examiner

*Primary Examiner*—Sun J Lin
(74) *Attorney, Agent, or Firm*—Winston Hsu

(57) ABSTRACT

A computer-aided thermal relief pad design system includes a depicting unit, a memory unit and a calculating unit. The depicting unit is used for depicting an elongated oval pattern of a thermal relief pad. The elongated oval pattern includes two perpendicular axes that intersect at a center point, and a plurality of terminals. The memory unit is used for storing formulae defining relationships between lengths of the two axes and coordinates of the terminals. The coordinates of the terminal define positions of the terminals relative to the center point. The calculating unit is used for calculating the coordinates of the terminals based on the formulae stored in the memory unit.

18 Claims, 4 Drawing Sheets

COMPUTER-AIDED THERMAL RELIEF PAD DESIGN SYSTEM AND METHOD

FIELD OF THE INVENTION

This invention relates to computer-aided printed circuit board design systems and methods and, more particularly, to a computer-aided design system and method for depicting patterns of thermal relief pads of printed circuit boards.

DESCRIPTION OF RELATED ART

A printed circuit board integrates numerous components including various pads. Before the components are integrated on the printed circuit board (PCB), patterns of the components should be depicted to their corresponding positions on the PCB. Depicting numerous patterns on a printed circuit board is a tedious task. Computer-aided design systems, for example, Allegro by Cadence Design Systems Inc., are developed to handle this tedious task. In order to provide a more compact printed circuit board, the patterns of the components need to be precisely calculated. Selecting an appropriate pattern for each component is critical for printed circuit board design. For example, for practical reasons, thermal relief pads in an elongated oval pattern may save much space than those in a circular pattern. An elongated oval pattern of a thermal relief pad includes four isometric parts. Each two neighboring parts are spaced by a thermal channel. General methods for depicting the elongated oval pattern of the thermal relief pad are to depict the elongated oval pattern based on predetermined coordinates of each part. The coordinates are usually calculated based on a plenty of formulae. Such calculations are tedious and time-consuming. Furthermore, it is complex to adjust dimensions of the elongated oval pattern.

Therefore, a computer-aided design system which can automatically depict patterns of thermal relief pads is desired.

SUMMARY OF INVENTION

A computer-aided thermal relief pad design system includes a depicting unit, a memory unit, and a calculating unit. The depicting unit is used for depicting an elongated oval pattern of a thermal relief pad. The elongated oval pattern of a thermal relief pad includes two perpendicular axes that intersect at a center point, and a plurality of terminals. The memory unit is used for storing formulae defining relationships between lengths of the two axes and coordinates of the terminals. The coordinates of the terminals define positions of the terminals relative to the center point. The calculating unit is used for calculating the coordinates of the terminals based on the formulae stored in the memory unit.

A computer-aided thermal relief pad design method includes steps of: determining the minimum lengths of two perpendicular axes of an elongated oval pattern of a thermal relief pad; calculating coordinates of terminals of the elongated oval pattern of thermal relief pad; and depicting the elongated oval pattern of the thermal relief pad based on the coordinates.

A computer-aided thermal relief pad design method includes steps of: dividing an elongated oval pattern of a thermal relief pad into four isometric parts, the four isometric parts are respectively located in the four quadrants of a coordinate system defined by two perpendicular axes of the thermal relief pad; calculating coordinates of one of the four isometric parts relative to the coordinate system; and calculating coordinates of the other three parts according to symmetrical rules.

Other advantages and novel features will become more apparent from the following detailed description of preferred embodiments when taken in conjunction with the accompanying drawings, in which:

DETAILED DESCRIPTION

Reference will now be made to the drawings to describe the preferred embodiment of the present design system, in detail.

Figure 1:
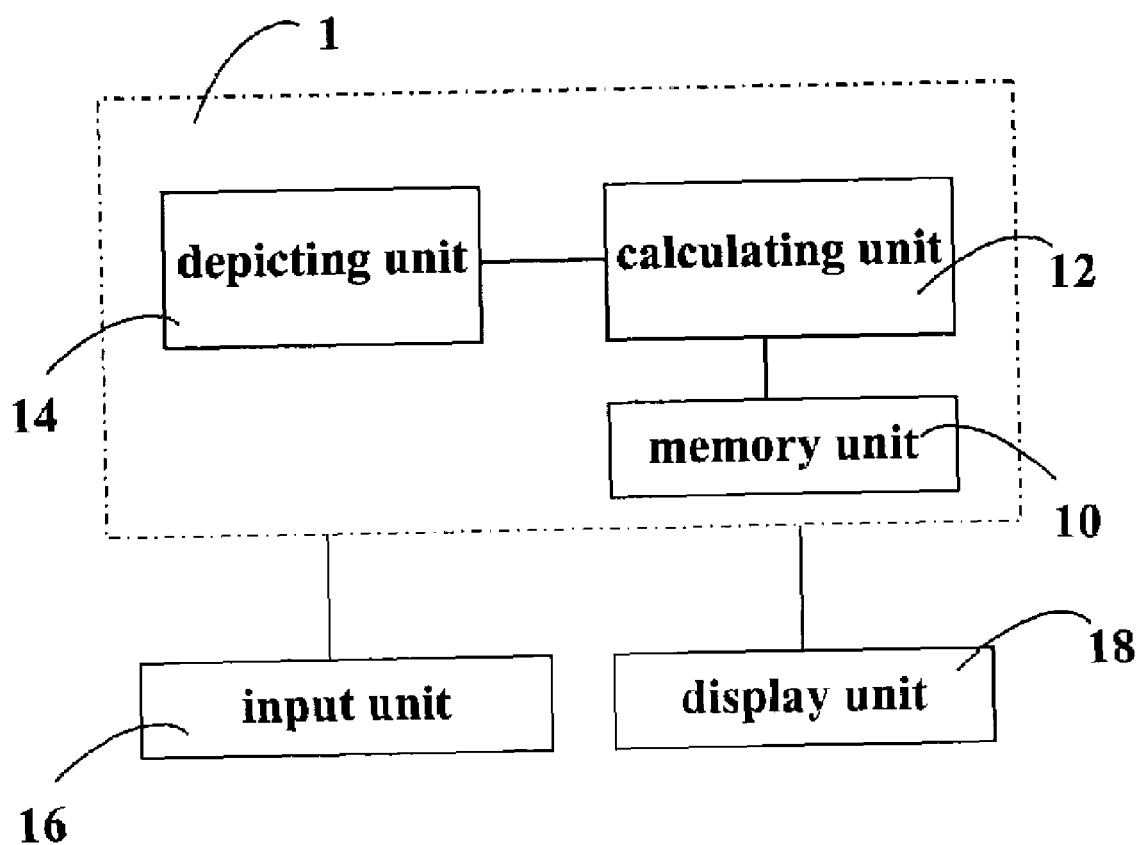
FIG. 1 is a block diagram of a computer-aided thermal relief pad design system in accordance with a preferred embodiment.

Referring to FIG. 1, a computer-aided thermal relief pad design system 1 (hereinafter referred to as design system) includes a memory unit 10, a calculating unit 12, and a depicting unit 14. The memory unit 10 is used for storing predetermined formulae that define relationships between coordinates of an elongated oval pattern of a thermal relief pad and lengths of axes of the elongated oval pattern. The calculating unit 12 is used for automatically calculating the coordinates of the elongated oval pattern according to the predetermined formulae. The depicting unit 14 is used for automatically depicting the elongated oval pattern based on given coordinates of the elongated oval pattern. A typical depicting unit 14 can be a design tool like Allegro provided by Cadence Design System Inc.

An input unit 16 is connected to the design system 1 for entering dimensions of the elongated oval pattern. A display unit 18 is also connected to the design system 1 for outputting the elongated oval design of the thermal relief pad.

Figure 2:
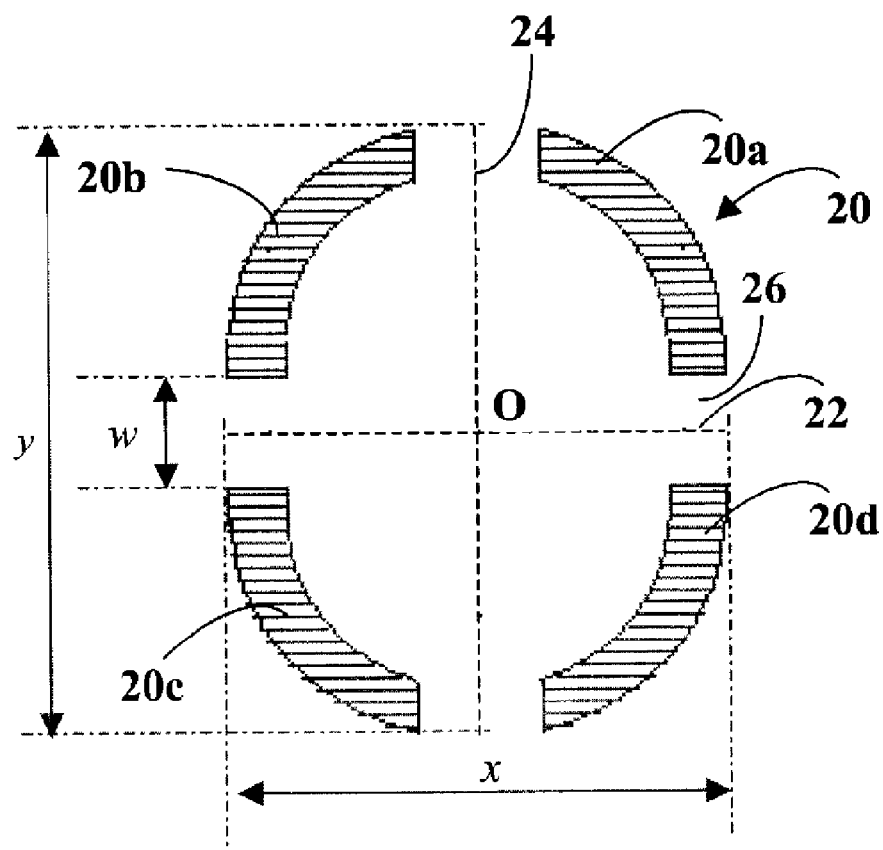
FIG. 2 is a schematic view of an elongated oval pattern of a thermal relief pad.

Referring to FIG. 2, an exemplary elongated oval pattern 2 of a thermal relief pad is illustrated. The elongated oval pattern 2 includes four isometric parts 20. Each two adjacent parts 20 are spaced by a thermal channel 26 with a width of w. The elongated oval pattern 2 includes a first axis 22 with a length of x and a second axis 24 with a length of y. The first and second axes 22 and 24 are perpendicular to each other. Relationships between w with a minimum x and y (hereinafter referred as to $Min(x, y)$) are defined as following:

| $Min(x, y)$ | w |
|---|---|
| $Min(x, y) \leq 10$ | 12 |
| $11 \leq Min(x, y) \leq 40$ | 15 |
| $41 \leq Min(x, y) \leq 70$ | 20 |
| $71 \leq Min(x, y) \leq 170$ | 30 |
| $Min(x, y) \geq 171$ | 40. |

It is assumed that the first and second axes 22 and 24 serve as reference axes in a Cartesian coordinate system. The first and second axes 22 and 24 meets at a center point O, and divides a plane where the four parts 20 locate into four quadrants. Each quadrant locates one of the four parts. A first part 20a is located in a first quadrant, in which both the first and second axes 22 and 24 are positive. A second part 20b is located in a second quadrant, and is symmetric to the first part 20a relative to the second axis 24. A third part 20c is located in a third quadrant, and is symmetric to the first part 20a relative to the center point 0. A fourth part 20d is located in a fourth quadrant, and is symmetric to the first part 20a relative to the first axis 22. For simplicity of the description, the first part 20a is used as an example for illustration.

Figure 3:
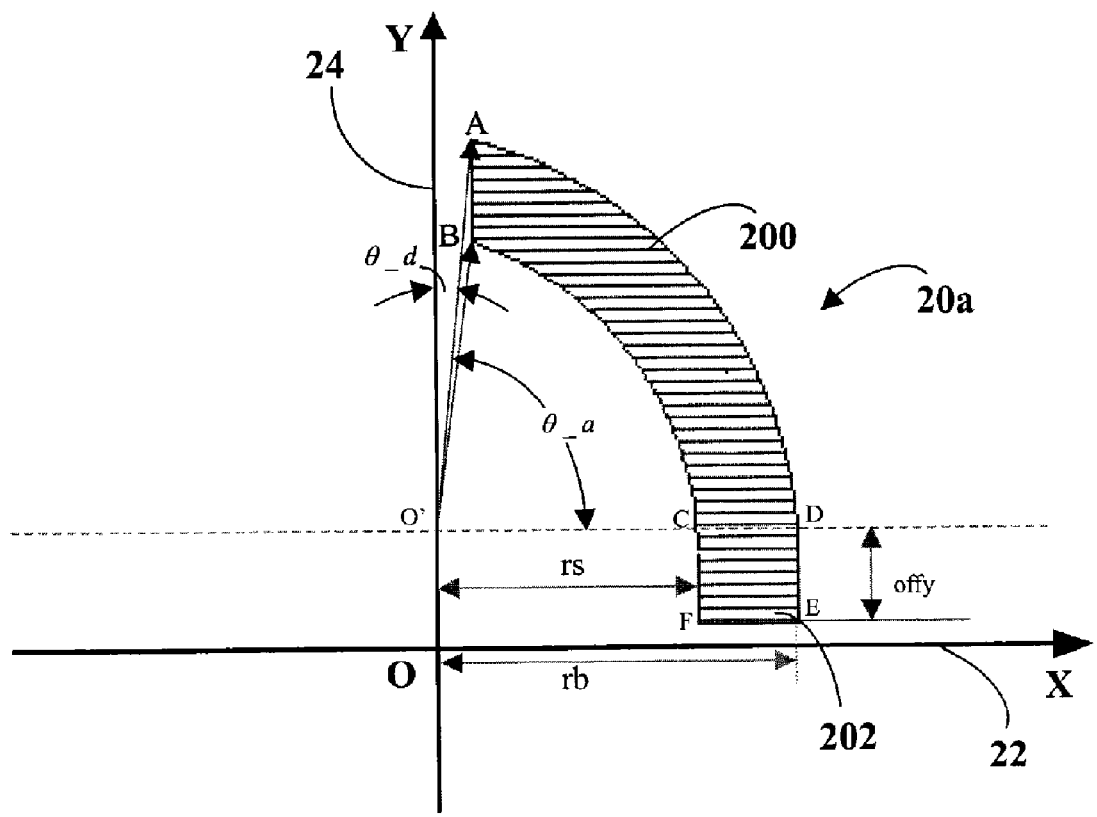
FIG. 3 is a schematic view of a quarter of the elongated oval pattern in FIG. 2.

Referring to FIG. 3, the first part 20 substantially includes a first section 200 and a second section 202. The first section 200 has a curved band shape similar to a shape defined between two parallel arcs of two concentric circles which subtend a same angle. Actually the first section 200 includes a first terminal A, a second terminal B, a third terminal C, and a fourth terminal D. The first and fourth terminals A and D construct a first arc having a first radius O'A with a length of rb. The second and third terminals B and C construct a second arc having a second radius O'B with a length of rs. A meeting point O' of the first radius O'B and the second radius O'A is positioned at the second axis 24. rs and rb satisfy conditions of: rb=Min(x, y)+30; rs=Min(x, y)+16.

The first terminal A of the first section 200, the meeting point O' and the third terminal C of the first section 200 define a first angle θ_a. The first terminal A of the first section 200, the meeting point O' and the second axis 24 define a second angle θ_d. θ_a and θ_d satisfy conditions of:

$$\theta\_a = a\cos\left(\frac{w}{2} \div rb\right)$$
$$\theta\_d = a\cos\left(\frac{w}{2} \div rs\right)$$

The second section 202 is substantially rectangular, and includes first and second terminals that are the same as the third and fourth terminals C and D of the first section 200 and also third and fourth terminals E and F. The second section 202 has a height of offy that satisfy the following condition:

$$offy = \frac{|y - x - w|}{2}$$

In order to position the first part 20 in the first quadrant, positions of the terminals of the first part 20 relative to the center point O should be obtained first. It is assumed that coordinates of the first terminal A of the first section 200 are ($a_0$, $a_1$). Where $a_0$, and $a_1$ represent relative distances from the first terminal A of the first section 200 to the second and first axis 24 and 22, and $a_0$, and $a_1$ satisfy:

$$a_0 = \frac{w}{2}$$
$$a_1 = rb*\sin(\theta\_a) + offy + \frac{w}{2} = \sqrt{rb^2 - \left(\frac{w}{2}\right)^2} + \frac{|y-x|}{2}$$

Accordingly, coordinates of the second terminal B of the first section 200 ($b_0$, $b_1$) satisfy:

$$b_0 = w/2$$
$$b_1 = rs*\sin(\theta\_d) + offy + w/2 = \sqrt{rs^2 - (w/2)^2} + |y-x|/2$$

Coordinates of the third terminal C of the first section 200 ($c_0$, $c_1$) satisfy:

$$c_0 = rs$$
$$c_1 = offy + \frac{w}{2} = \frac{|y-x|}{2}$$

Coordinates of the fourth terminal D of the first section 200 ($d_0$, $d_1$) satisfy:

$$d_0 = rb$$
$$d_1 = offy + \frac{w}{2} = \frac{|y-x|}{2}$$

Coordinates of the third terminal E of the second section 202 ($e_0$, $e_1$) satisfy:

$$e_0 = rb$$
$$e_1 = \frac{w}{2}$$

Coordinates of the fourth terminal F of the second section 202 ($f_0$, $f_1$) satisfy:

$$f_0 = rs$$
$$f_1 = \frac{w}{2}$$

The second part 20b is symmetric to the first part 20a relative to the second axis 24, the third part 20c is symmetric to the first part 20a relative to the center point O, and the fourth part 20d is symmetric to the first part 20a relative to the first axis 22. Therefore, coordinates of the other three parts 20b, 20c and 20d can be obtained according to symmetrical rules.

Figure 4:
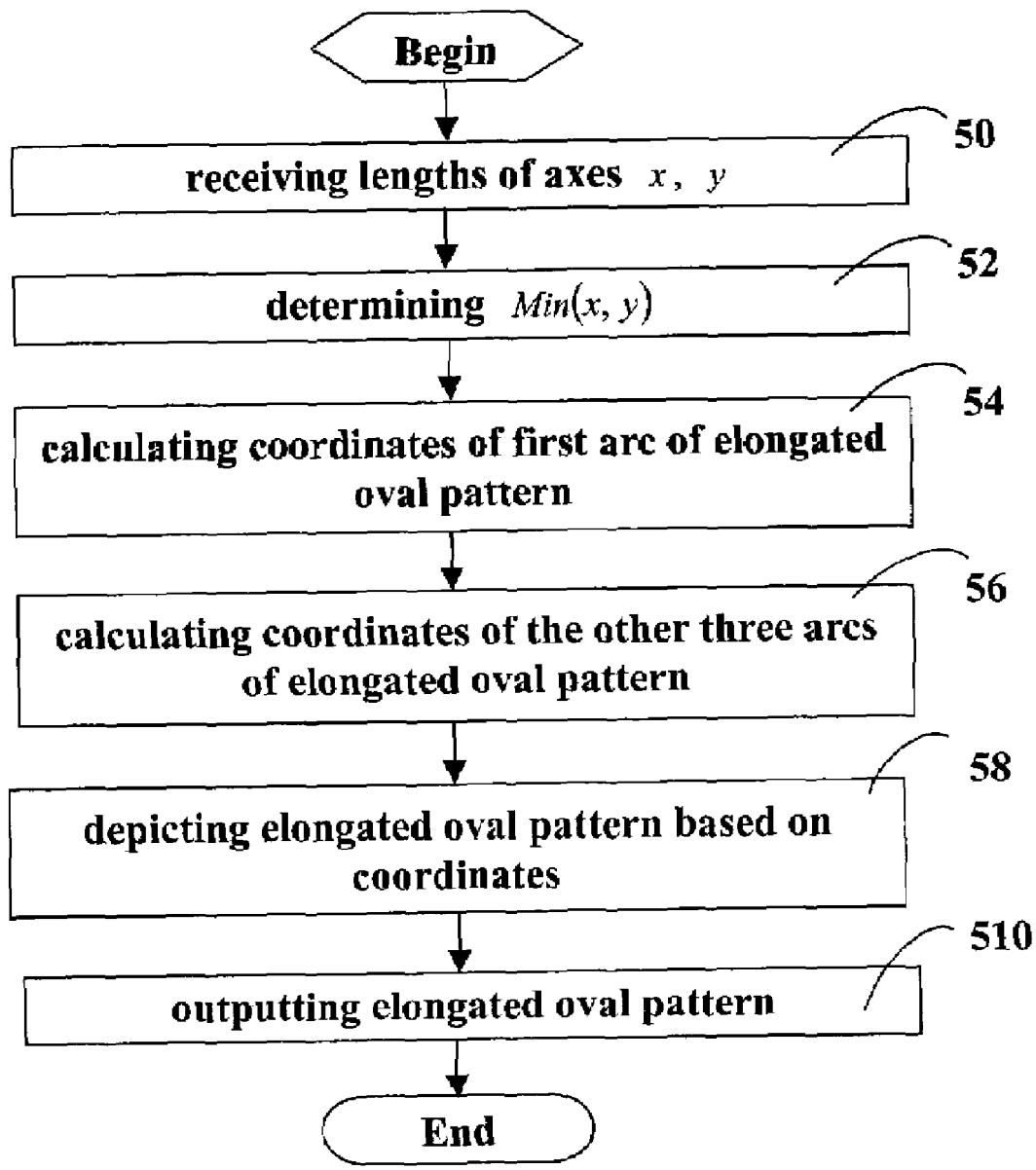
FIG. 4 is a flow chart illustrating a depicting procedure of the computer-aided thermal relief pad design system of FIG. 1.

Referring to FIG. 4, a depicting procedure of the design system 1 is illustrated. The depicting procedure begins at step 50, where the calculating unit 12 receives the lengths x and y of the first and second axis 22 and 24. Then, in step 52, the calculating unit 12 determines Min(x, y). The depicting procedure then proceeds to step 54. In step 54, the calculating unit 12 calculates values of w, rs and rb based on the relationships between w, rs, rb, and Min(x, y). Then, coordinates of the first part 20 are obtained based on the above-mentioned formulae. According to symmetrical rules, the calculating unit 10 obtains the coordinates of the other three parts (step 56). The depicting procedure then proceeds to step 58, where the depicting unit 14 automatically depicts the elongated oval pattern 2 based on the coordinates obtained in steps 54 and 56. Finally, in step 510, the elongated oval pattern 2 of the thermal relief pad is outputted through the display unit 18.

The embodiment described herein are merely illustrative of the principles of the present invention. Other arrangements and advantages may be devised by those skilled in the art without departing from the spirit and scope of the present invention. Accordingly, the present invention should be deemed not to be limited to the above detailed description, but rather by the spirit and scope of the claims that follow, and their equivalents.

What is claimed is:

1. A computer-aided thermal relief pad design system, comprising:
 a depicting unit for depicting an elongated oval pattern of a thermal relief pad, the elongated oval pattern having two perpendicular axes intersecting at a center point, the two perpendicular axes dividing the elongated oval pattern into four isometric parts, each two neighboring isometric parts being spaced by a thermal channel, and each isometric part comprising a plurality of terminals;
 a memory unit for storing formulae defining predetermined relationships between lengths of the two perpendicular axes and coordinates of the plurality of terminals of one of the four isometric parts, the coordinates of the plurality of terminals defining positions of the one of the four isometric parts relative to the center point; and
 a calculating unit for receiving the lengths of the two perpendicular axes, and calculating the coordinates of the plurality of terminals of the one of the four isometric parts based on the formulae stored in the memory unit, and calculating coordinates of a plurality of terminals of the other three isometric parts according to symmetrical rules;
 wherein the depicting unit depicts the four isometric parts of the elongated oval pattern based on the coordinates of the plurality of terminals of each isometric part.

2. The computer-aided thermal relief pad design system as claimed in claim 1, wherein each isometric part includes a first section having a curved band shape similar to a shape defined between two concentric arcs and a substantially rectangular second section.

3. The computer-aided thermal relief pad design system as claimed in claim 2, wherein the first section comprises four of the plurality of terminals of one of the four isometric parts, the second section comprises four of the plurality of terminals of the one of the four isometric parts, with two terminals of the second section overlapping two terminals of the first section, wherein coordinates of one first terminal (a0, a1) satisfy:

$$a_0 = \frac{w}{2};$$
$$a_1 = \sqrt{rb^2 - \left(\frac{w}{2}\right)^2} + \frac{|y-x|}{2};$$

coordinates of one second terminal (b0, b1) satisfy:

$$b_0 = \frac{w}{2}; \quad b_1 = \sqrt{rs^2 - \left(\frac{w}{2}\right)^2} + \frac{|y-x|}{2};$$

coordinates of one third terminal (c0, c1) satisfy:

$$c_0 = rs;$$
$$c_1 = \frac{|y-x|}{2};$$

coordinates of one fourth terminal (d0, d1) satisfy:

$$d_0 = rb;$$

$$d_1 = \frac{|y-x|}{2};$$

coordinates of one fifth terminal (e0, e1) satisfy:

$$e_0 = rb;$$
$$e_1 = \frac{w}{2};$$

and coordinates of one sixth terminal (f0, f1) satisfy:

$$f_0 = rs;$$
$$f_1 = \frac{w}{2};$$

wherein w represents a width of the thermal channel, x and y represent the lengths of the two perpendicular axes respectively, rs and rb represent values of two radii of the two concentric arcs of the first section.

4. The computer-aided thermal relief pad design system as claimed in claim 3, wherein w satisfies the following conditions:

| Min(x, y) | w |
|---|---|
| Min(x, y) ≤ 10 | 12 |
| 11 ≤ Min(x, y) ≤ 40 | 15 |
| 41 ≤ Min(x, y) ≤ 70 | 20 |
| 71 ≤ Min(x, y) ≤ 170 | 30 |
| Min(x, y) ≥ 171 | 40. |

5. The computer-aided thermal relief pad design system as claimed in claim 3, wherein rs and rb satisfy the following conditions:

rb=Min(x,y)+b 30; rs=Min(x, y)+16.

6. The computer-aided thermal relief pad design system as claimed in claim 3, wherein x and y is received from an input unit connected to the computer-aided thermal relief pad design system.

7. A computer-aided thermal relief pad design method comprising:
 receiving lengths of two perpendicular axes of an elongated oval pattern of a thermal relief pad, the two perpendicular axes defining a coordinate system, the elongated oval pattern comprising four isometric parts;
 calculating coordinates of a plurality of terminals of one of the four isometric parts relative to the coordinate system, based on formulae defining predetermined relationships between the coordinates of the plurality of terminals and the lengths of the two perpendicular axes;
 calculating coordinates of a plurality of terminals of the other three isometric parts according to symmetrical rules; and
 depicting the four isometric parts of the elongated oval pattern based on the coordinates of the plurality of terminals of each isometric part.

8. The computer-aided thermal relief pad design method as claimed in claim 7, wherein each two neighboring isometric parts being spaced by a thermal channel with a width of w, the method further comprises a step of calculating the width of the thermal channel based on predetermined relationships between the width of the thermal channel and the lengths of the two perpendicular axes.

9. The computer-aided thermal relief pad design method as claimed in claim 8, wherein each isometric part comprises a first section having a curved band shape similar to a shape defined between two concentric arcs with a first radius rs and a second radius rb, and a substantially rectangular second section, the method further comprises a step of calculating the first and second radii based on predetermined relationships between the first and second radii and the lengths of the two perpendicular axes.

10. The computer-aided thermal relief pad design method as claimed in claim 9, wherein the predetermined relationships between the first radius rs and the second radius rb and the lengths of the two perpendicular axes are defined as follows:

$$rb = \text{Min}(x,y) + 30; \quad rs = \text{Min}(x,y) + b\ 16;$$

x and y represent the lengths of the two perpendicular axes respectively.

11. The computer-aided thermal relief pad design method as claimed in claim 9, wherein the first section of the one of the four isometric parts comprises four of the plurality of terminals of the one of the four isometric parts, the second section of the one of the four isometric parts comprises four of the plurality of terminals of the one of the four isometric parts, with two terminals of the second section overlapping two terminals of the first section, wherein coordinates of one first terminal (a0, a1) satisfy:

$$a_0 = \frac{w}{2};$$

$$a_1 = \sqrt{rb^2 - \left(\frac{w}{2}\right)^2} + \frac{|y-x|}{2};$$

coordinates of one second terminal (b0, b1) satisfy:

$$b_0 = \frac{w}{2}; \quad b_1 = \sqrt{rs^2 - \left(\frac{w}{2}\right)^2} + \frac{|y-x|}{2};$$

coordinates of one third terminal (c0, c1) satisfy:

$$c_0 = rs;$$

$$c_1 = \frac{|y-x|}{2};$$

coordinates of one fourth terminal (d0, d1) satisfy:

$$d_0 = rb;$$

$$d_1 = \frac{|y-x|}{2};$$

coordinates of one fifth terminal (e0, e1) satisfy:

$$e_0 = rb;$$

$$e_1 = \frac{w}{2};$$

and coordinates of one sixth terminal (f0, f1) satisfy:

$$f_0 = rs;$$

$$f_1 = \frac{w}{2};$$

x and y represent the lengths of the two perpendicular axes respectively.

12. The computer-aided thermal relief pad design method as claimed in claim 8, wherein the predetermined relationships between the width w of the thermal channel and the lengths of the two perpendicular axes are defined as follows:

| Min(x, y) | w |
| --- | --- |
| Min(x, y) ≤ 10 | 12 |
| 11 ≤ Min(x, y) ≤ 40 | 15 |
| 41 ≤ Min(x, y) ≤ 70 | 20 |
| 71 ≤ Min(x, y) ≤ 170 | 30 |
| Min(x, y) ≥ 171 | 40. |

13. A computer-aided thermal relief pad design method, comprising:
   dividing an elongated oval pattern of a thermal relief pad into four isometric parts, the four isometric parts being respectively located in four quadrants of a coordinate system defined by two perpendicular axes of the elongated oval pattern;
   receiving lengths of the two perpendicular axes of the elongated oval pattern;
   calculating coordinates of a plurality of terminals of one of the four isometric parts relative to the coordinate system, based on formulae defining predetermined relationships between the coordinates of the plurality of terminals and the lengths of the two perpendicular axes;
   calculating coordinates of a plurality of terminals of the other three isometric parts according to symmetrical rules; and
   depicting the four isometric parts of the elongated oval pattern based on the coordinates of the plurality of terminals of each isometric part.

14. The computer-aided thermal relief pad design method as claimed in claim 13, wherein each isometric part comprises a first section having a curved band shape similar to a shape defined between two concentric arcs and a substantially rectangular second section, the method further comprises a step of calculating first and second radii rs and rb of the two concentric arcs based on predetermined relationships between the first and second radii and the lengths of the two perpendicular axes.

15. The computer-aided thermal relief pad design method as claimed in claim 14, wherein each two neighboring isometric parts are spaced by a thermal channel with a width of w, the method further comprises a step of calculating the width of the thermal channel based on predetermined relationships between the width of the thermal channel and the lengths of the two perpendicular axes.

16. The computer-aided thermal relief pad design method as claimed in claim 15, wherein the one of the four isometric parts of the elongated oval pattern comprises a first section having a curved band shape similar to a shape defined between two concentric arcs with a first radius rs and a second radius rb, and a substantially rectangular second section, the first section comprises four of the plurality of terminals of the one of the four isometric parts, the second section comprises four of the plurality of terminals of the one of the four isometric parts, with two terminals of the second section overlapping two terminals of the first section, wherein coordinates of one first terminal (a0, a1) satisfy:

$$a_0 = \frac{w}{2};$$

$$a_1 = \sqrt{rb^2 - \left(\frac{w}{2}\right)^2} + \frac{|y-x|}{2};$$

coordinates of one second terminal (b0, b1) satisfy:

$$b_0 = \frac{w}{2}; \, b_1 = \sqrt{rs^2 - \left(\frac{w}{2}\right)^2} + \frac{|y-x|}{2};$$

coordinates of one third terminal (c0, c1) satisfy:

$$c_0 = rs;$$

$$c_1 = \frac{|y-x|}{2};$$

coordinates of one fourth terminal (d0, d1) satisfy:

$$d_0 = rb;$$

$$d_1 = \frac{|y-x|}{2};$$

coordinates of one fifth terminal (e0, e1) satisfy:

$$e_0 = rb;$$

$$e_1 = \frac{w}{2};$$

coordinates of one sixth terminal (f0, f1) satisfy:

$$f_0 = rs;$$

$$f_1 = \frac{w}{2}.$$

17. The computer-aided thermal relief pad design method as claimed in claim 15, wherein the predetermined relationships between the width w of the thermal channel and the lengths of the two perpendicular axes are defined as follows:

| Min(x, y) | w |
| --- | --- |
| Min(x, y) ≤ 10 | 12 |
| 11 ≤ Min(x, y) ≤ 40 | 15 |
| 41 ≤ Min(x, y) ≤ 70 | 20 |
| 71 ≤ Min(x, y) ≤ 170 | 30 |
| Min(x, y) ≥ 171 | 40. |

18. The computer-aided thermal relief pad design method as claimed in claim 14, wherein the predetermined relationships between the first radius rs and the second radius rb and the lengths of the two perpendicular axes are defined as follows:

$$rb = Min(x,y) + 30; \, rs = Min(x,y) + 16;$$

wherein x and y, represent lengths of the two perpendicular axes, respectively.

* * * * *